United States Patent
Chang et al.

(10) Patent No.: US 7,053,805 B2
(45) Date of Patent: May 30, 2006

(54) METHOD FOR COMPENSATING GAIN MISMATCH BETWEEN TWO DACS AND APPARATUS THEREOF

(75) Inventors: Chia-Yi Chang, I-Lan Hsien (TW); Yeou-Jyh Tsai, Hsin-Chu (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 0 days.

(21) Appl. No.: 10/906,968

(22) Filed: Mar. 14, 2005

(65) Prior Publication Data

US 2005/0219087 A1    Oct. 6, 2005

Related U.S. Application Data

(60) Provisional application No. 60/521,238, filed on Mar. 18, 2004.

(30) Foreign Application Priority Data

Oct. 15, 2004  (TW) ............... 93131387 A

(51) Int. Cl.
*H03M 1/10*  (2006.01)
(52) U.S. Cl. .............. 341/120; 341/144; 341/155
(58) Field of Classification Search ............... 341/144, 341/145, 155, 156, 118, 120, 141, 159, 161
See application file for complete search history.

(56) References Cited

U.S. PATENT DOCUMENTS

| | | | |
|---|---|---|---|
| 4,736,189 A * | 4/1988 | Katsumata et al. | ......... 341/120 |
| 5,121,119 A * | 6/1992 | Higuchi et al. | ............ 341/120 |
| 5,278,558 A | 1/1994 | Roth | |
| 6,501,405 B1 | 12/2002 | Zhang et al. | |
| 6,707,404 B1 | 3/2004 | Yilmaz | |
| 2001/0028320 A1 | 10/2001 | Prendergast et al. | |
| 2005/0219087 A1 | 10/2005 | Chang et al | |

* cited by examiner

*Primary Examiner*—John B Nguyen
(74) *Attorney, Agent, or Firm*—Winston Hsu

(57) ABSTRACT

The present invention discloses a method and related apparatus for compensating a gain mismatch between a first DAC and a second DAC. The second DAC is connected to a gain amplifier. The method includes the following steps. Determine a first gain value corresponding to the first DAC. Control the gain amplifier with a first control value and determine a second gain value corresponding to the second DAC and the gain amplifier. Control the gain amplifier with a second control value and determine a third gain value corresponding to the second DAC and the gain amplifier. Without utilizing a predetermined characteristic parameters, determine a calibration control value according to the first, second, third gain values, and the first and second control values. Control the gain amplifier with the calibration control value to compensate for the gain mismatch between the first DAC and the second DAC.

15 Claims, 7 Drawing Sheets

METHOD FOR COMPENSATING GAIN MISMATCH BETWEEN TWO DACS AND APPARATUS THEREOF

CROSS REFERENCE TO RELATED APPLICATIONS

This application claims the benefit of U.S. Provisional Application No. 60/521,238, which was filed on Mar. 18, 2004 and entitled "TX ADC DC Offset and Gain Mismatch Calibration Using Two-point Interpolation".

BACKGROUND

The present invention relates to digital to analog converters (DAC), and more particularly, to a method for compensating gain mismatch between two DACs, and an apparatus thereof.

Generally speaking, no matter what kind of modulation scheme is employed by a communication system, DACs to convert digital modulated signals into analog signals. Analog signals are then processed, for example, amplified or frequency upgraded, to generate final analog signals for transmission. When designing a communication system, DACs are usually assumed to be ideal components. Unfortunately, DACs employed by a transmitter have some less than ideal characteristics. One non-ideal characteristic is referred to as "IQ gain mismatch effect". More specifically, in a transmitter, the gain of a DAC in an in-phase channel (I channel) is usually slightly different from the gain of another DAC utilized in a quadrature channel (Q channel). The IQ gain mismatch effect deteriorates signal quality. Hence, for communication systems requiring high signal transmission quality, the IQ gain mismatch effect is a problem that demands careful handling.

Generally speaking, two compensation schemes can be utilized to solve the IQ gain mismatch problem. The first is a digital compensation scheme. The second is an analog compensation scheme. The digital compensation scheme operates in the digital domain (i.e. digital signals are compensated before being applied to DACS). The analog compensation scheme operates in the analog domain (i.e. analog signals are compensated after being generated by DACS). Since the digital compensation scheme requires a great amount of computation, the analog compensation scheme is always utilized by communication systems.

To compensate a gain mismatch between two DACs of a transceiver's I transmission channel and Q transmission channel, a conventional method utilizes analog to digital converters (ADCs), which already exist in the transceiver, as measuring tools for determining the gain mismatch. FIG. 1, FIG. 2, and FIG. 3 are diagrams illustrating how devices are arranged when the method of the related art is utilized to compensate for a gain mismatch between two DACS. First, in FIG. 1, a DAC 110 in an I transmission channel of a transceiver is connected to an ADC 130 in an I receiving channel of the transceiver; a DAC 120 in a Q transmission channel of the transceiver is connected to an ADC 140 in a Q receiving channel of the transceiver. Two digital values $Z_I$ and $Z_Q$ received by a computation module 150 are as follows:

$$Z_I = \rho_{ZYI} \cdot \rho_{YXI} \cdot X_I \qquad (1)$$

$$Z_Q = \rho_{ZYQ} \cdot \rho_{YXQ} \cdot X_Q \qquad (2)$$

where $\rho_{YXI}$ and $\rho_{YXQ}$ are gain values of the DACs 110 and 120 respectively; $\Sigma_{zyi}$ and $\rho_{ZYQ}$ are gain values of the ADCs 130 and 140 respectively.

If $X_I$ is equal to $X_Q$, after divides $Z_I$ by $Z_Q$, then the computation module 150 can get the following equation:

$$R_1 = (Z_I / Z_Q) \qquad (3)$$
$$= (\rho_{ZYI} / \rho_{ZYQ}) \cdot (\rho_{YXI} / \rho_{YXQ}) \cdot (X_I / X_Q)$$
$$= G_{RX} \cdot G_{TX} \cdot 1$$

where $G_{RX} = \rho_{ZYI} / \rho_{ZYQ}$ represents a gain mismatch between the ADCs 130 and 140; $G_{TX} = \rho_{YXI} / \rho_{YXQ}$ represents a gain mismatch between the DACs 110 and 120.

Next, in FIG. 2, the DAC 110 in the I transmission channel is connected to the ADC 140 in the Q receiving channel; the DAC 120 in the Q transmission channel is connected to the ADC 130 in the I receiving channel. The digital values $Z_I$ and $Z_Q$ received by the computation module 150 are as follows:

$$Z_I = \rho_{ZYI} \cdot \rho_{YXQ} \cdot X_Q \qquad (4)$$

$$Z_Q = \rho_{ZYQ} \cdot \rho_{YXI} \cdot X_I \qquad (5)$$

If $X_I$ is equal to $X_Q$, after divides $Z_I$ by $Z_Q$, the computation module 150 can get the following equation:

$$R_2 = (Z_I / Z_Q) \qquad (6)$$
$$= (\rho_{ZYI} / \rho_{ZYQ}) \cdot (\rho_{YXQ} / \rho_{YXI}) \cdot (X_Q / X_I)$$
$$= G_{RX} / G_{TX}$$

With equation (3) and equation (6), it is quite a simple job for the computation module 150 to determine the gain mismatch values $G_{TX}$ and $G_{RX}$. More specifically, these two values can be determined according to the following equations:

$$G_{TX} = \sqrt{R_1/R_2} \qquad (7)$$

$$G_{RX} = \sqrt{R_1 \bullet R_2} \qquad (8)$$

After the gain mismatch value $G_{TX}$ between the I channel DAC 110 and the Q channel DAC 120 is determined, under a normal operation mode, the related art system arranges the transmitting part of the transceiver into the configuration shown in FIG. 3. More specifically, the output end of the Q channel DAC 120 is connected to a gain amplifier 160. Certainly, the gain amplifier 160 can also be connected to the output end of the I channel DAC 110 rather than the Q channel DAC 120. With the gain amplifier 160, an analog signal $Y_Q$ generated by the DAC 120 is amplified into another analog signal $Y'_Q$, the gain mismatch between the DAC 110 and DAC 120 is then compensated. In other words, the gain of the DAC 110 is equal to the gain of the DAC 120 multiplied with the gain of the gain amplifier 160. However, since the gain of the gain amplifier 160 is determined by a control value C, the computation module 150 of the related art must be built with a mapping relationship between the gain of the gain amplifier 160 and the control value C. With the built-in mapping relationship, the computation module 150 can then determine a suitable calibration control value $C_C$ according to the determined gain mismatch value $G_{TX}$.

The method of the related art must survey many sample chips to determine an averaged mapping relationship then set the averaged mapping relationship in each individual system utilizing the chips. However, gain amplifiers on different chips do not always have the same characteristics. Even within a single chip, characteristic parameters of the chip do not always remain fixed. Hence, the method of the related art does not always compensate for the gain mismatch effect of two DACs accurately and is therefore not an optimal solution.

SUMMARY

An objective of the claimed invention is to provide a method and related apparatus for compensating a gain mismatch between two DACs without utilizing any predetermined characteristic parameter.

According to the claimed invention, a method for compensating a gain mismatch between a first DAC and a second DAC is disclosed. The second DAC is electrically connected to a gain amplifier. The method comprising: determining a first gain value corresponding to the first DAC; controlling the gain amplifier with a first control value, and determining a second gain value corresponding to the second DAC and the gain amplifier; controlling the gain amplifier with a second control value, and determining a third gain value corresponding to the second DAC and the gain amplifier; determining a calibration control value according to the first, second, and third gain values and the first and second control values without utilizing a predetermined characteristic parameter; and controlling the gain amplifier with the calibration control value to compensate for the gain mismatch between the first DAC and the second DAC.

Also according to the claimed invention, a method for compensating a gain mismatch between a first DAC and a second DAC is disclosed. The second DAC is electrically connected to a gain amplifier. The method comprising: controlling the gain amplifier with a first control value, and determining a first gain ratio of a first signal path to a second signal path; controlling the gain amplifier with the first control value, and determining a second gain ratio of a third signal path to a fourth signal path; controlling the gain amplifier with a second control value, and determining a third gain ratio of the third signal path to the fourth signal path; determining a calibration control value according to the first, second, and third gain ratios and the first and second control values without utilizing a predetermined characteristic parameter; and controlling the gain amplifier with the calibration control value to compensate for the gain mismatch between the first DAC and the second DAC. Wherein the first signal path corresponds to the first DAC and a first ADC, the second signal path corresponds to the second DAC, the gain amplifier, and a second ADC, the third signal path corresponds to the first DAC and the second ADC, the fourth signal path corresponds to the second DAC, the gain amplifier, and the first ADC.

These and other objectives of the present invention will no doubt become obvious to those of ordinary skill in the art after reading the following detailed description of the preferred embodiment that is illustrated in the various figures and drawings.

DETAILED DESCRIPTION

To avoid the inaccurate calibration problem caused by utilizing predetermined characteristic parameters, the present invention compensates the IQ gain mismatch between two DACs without utilizing any predetermined characteristic parameter. More specifically, the present invention utilizes an interpolation (or extrapolation) method to determine a calibration control value $C_C$ utilized to control a gain amplifier for compensating the IQ gain mismatch between the two DACs. Since no predetermined characteristic parameter is required, the present invention does not need to perform tests on a multitude of sample chips to determine the needed parameters (e.g., such as the above-mentioned mapping relationship). Additionally, no predetermined parameter is required to be pre-stored in each system; hence memory space is further saved.

Please note that a gain amplifier utilized in the analog domain is usually a log-style gain amplifier. The control value C of the gain amplifier has a linear relationship with respect to the logarithm of the gain G of the amplifier. In other words, $G=\exp(h \cdot C)$, where h is a characteristic parameter of the gain amplifier. In the following paragraphs this kind of log-style gain amplifier is utilized as an example for illustrating the present invention. However, the present invention is not limited to log-style gain amplifiers. Other kinds of gain amplifiers, such as a gain amplifier having a linear relationship between its control value C and gain G, can also be utilized with the present invention. Even thought the used equations are slightly different from the equations going to be mentioned in the following paragraphs, the ideas of the present invention remain the same. According to the ideas of the present invention, it is quite a simple job for a person skilled in the art to deduce equations for the situations when other kinds of gain amplifiers are used; hence, further description is omitted here.

Figure 1:
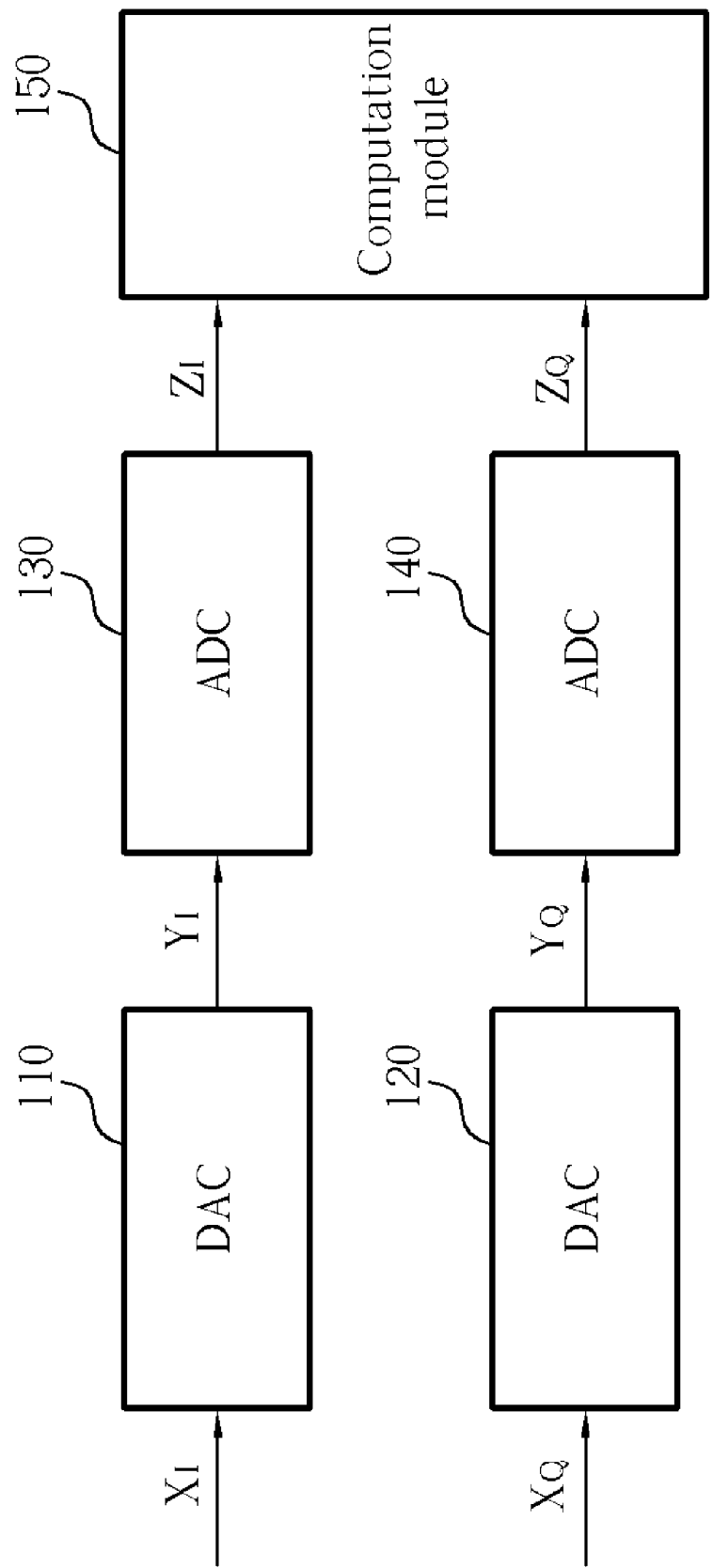
FIG. 1, FIG. 2, and FIG. 3 are block diagrams illustrating how devices are arranged when the method of the related art is utilized to compensate for a gain mismatch between two DACs.
Figure 2:
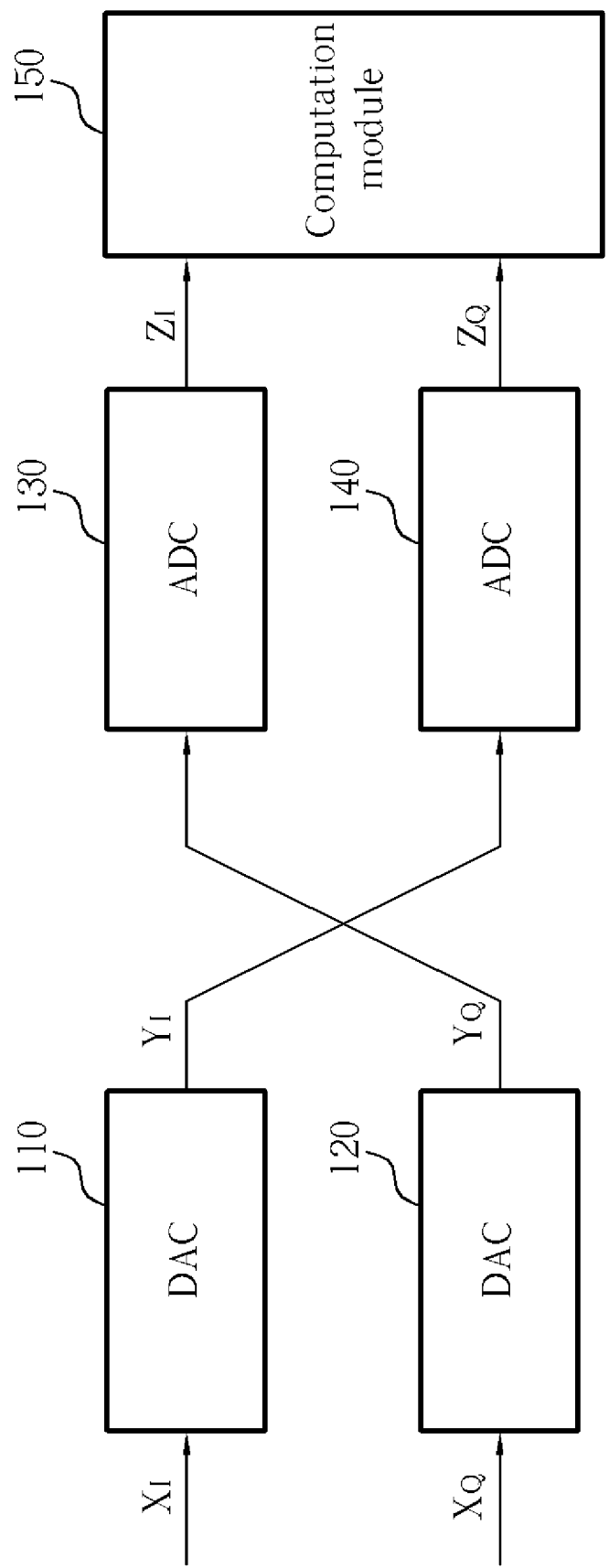
Figure 3:
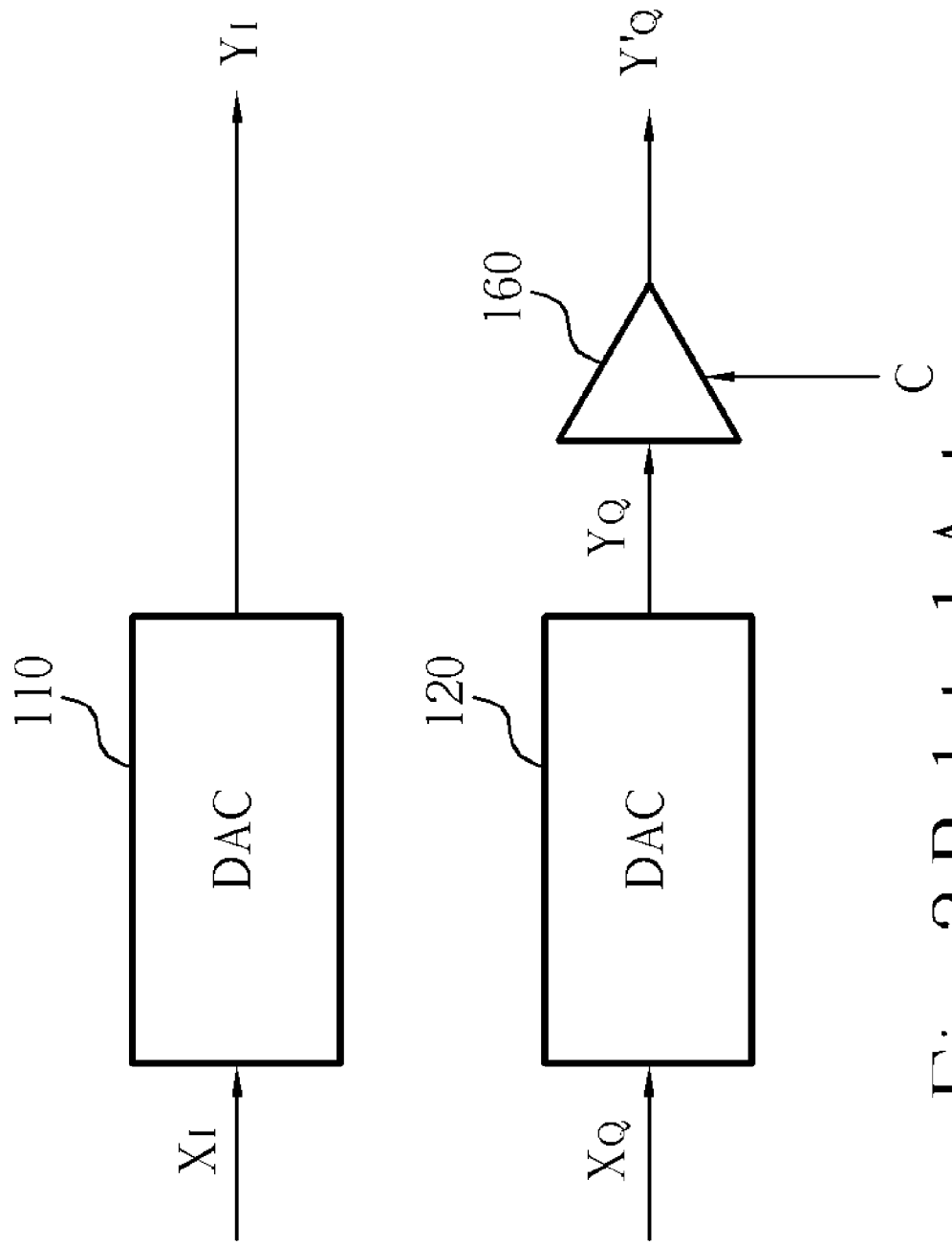
Figure 4:
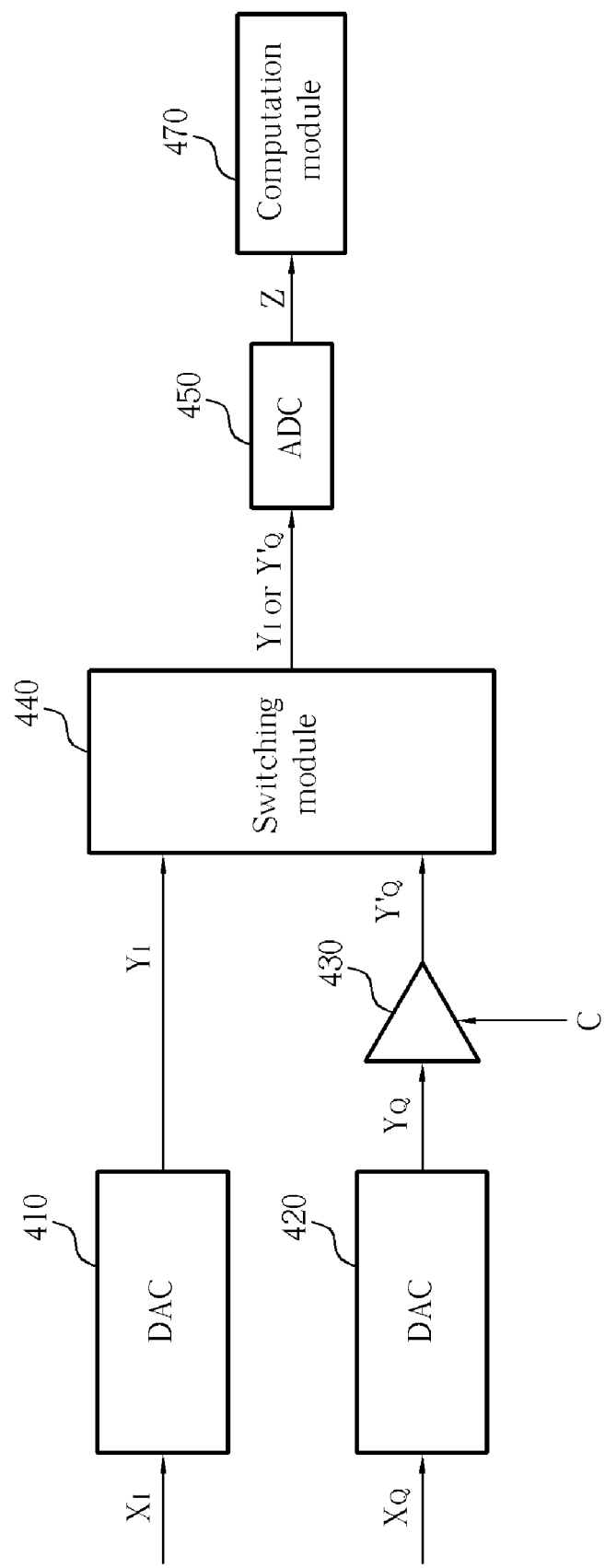
FIG. 4 is a block diagram showing how circuit components are disposed according to a first embodiment of the present invention.

Please refer to FIG. 4. FIG. 4 is a block diagram showing how circuit components are disposed according to a first embodiment of the present invention. The block diagram shown in FIG. 4 includes a first DAC 410, a second DAC 420, a gain amplifier 430, a switching module 440, an ADC 450, and a computation module 470. For example, the first DAC 410 and second DAC 420 are DACs of an I transmission channel and Q transmission channel of a transceiver respectively; the ADC 450 is an ACD in the I receiving channel or Q receiving channel of the transceiver. Certainly, the ADC 450 can also be an ADC built in a transmitter, which includes the first DAC 410 and the second DAC 420. The gain amplifier 430 amplifies an analog signal $Y_Q$ outputted by the second DAC 420 to generate an analog signal $Y'_Q$; a gain value G of the gain amplifier 430 is controlled by a control value C. The switching module 440 has two modes. In the first mode the switching module 440 connects the first DAC 410 with the ADC 450. In the second mode, the switching module 440 connects the gain amplifier 430 with the ADC 450.

Figure 5:
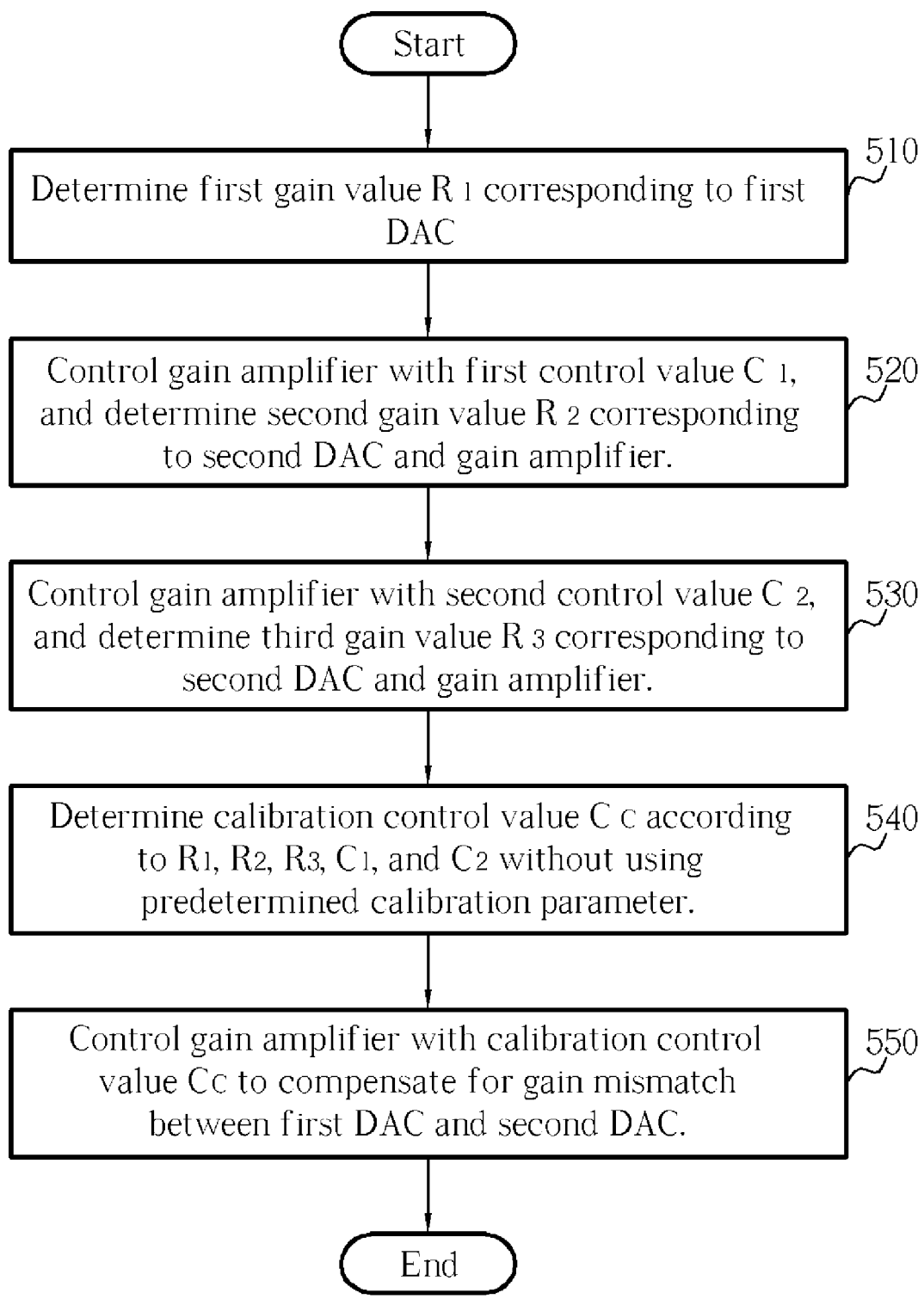
FIG. 5 is a flowchart illustrating a method performed by the apparatus of FIG. 4.

FIG. 5 shows a flowchart illustrating a method performed by the apparatus of FIG. 4. The flowchart shown in FIG. 5 includes the following steps:

Step 510: Determine a first gain value $R_1$ corresponding to the first DAC 410. In this step, the switching module 440 is set to the first mode. With a digital input $X_I = X_1$ being applied to the first DAC 410, an analog output $Y_I = Y_1$ is generated. The ADC 450 is utilized as a measuring tool for receiving the analog output $Y_I$ of the DAC 410 and generating a digital output $Z = Z_1$. In this embodiment, the above-mentioned first gain value $R_1$ is the gain of the serially connected first DAC 410 and ADC 450. The first gain value $R_1$ can be expressed by the following equation:

$$R_1 = (Z_1/X_1) = \rho_{ZY} \cdot \rho_{YXI} \qquad (9)$$

where $\rho_{YXI}$ represents the gain of the first DAC 410 and $\rho_{ZY}$ represents the gain of the ADC 450.

Step 520: Control the gain amplifier 430 with a first control value $C_1$, and determine a second gain value $R_2$ corresponding to the second DAC 420 and the gain amplifier 430. In this step, the switching module 440 is set to the second mode. With a digital input $X_Q = X_2$ being applied to the second DAC 420, an analog output $Y_Q = Y_2$ is generated. The gain amplifier 430 generates an analog output $Y'_Q = Y_2 \cdot \exp(h \cdot C_1)$, where $\exp(h \cdot C_1)$ is the gain of the gain amplifier 430 when the gain amplifier 430 is controlled by the first control value $C_1$. The ADC 450 receives the analog output $Y'_Q$ of the gain amplifier 430 and generates a digital output $Z = Z_2$. In this embodiment, the above-mentioned second gain value $R_2$ is the gain of the serially connected second DAC 420, gain amplifier 430, and ADC 450. The second gain value $R_2$ can be expressed by the following equation:

$$R_2 = (Z_2/X_2) = \rho_{ZY} \cdot \exp(h \cdot C_1) \cdot \rho_{YXQ} \qquad (10)$$

where $\rho_{YXQ}$ represents the gain of the second DAC 420.

Step 530: Control the gain amplifier 430 with a second control value $C_2$, and determine a third gain value $R_3$ corresponding to the second DAC 420 and the gain amplifier 430. In this step, the switching module 440 is set to the second mode. With a digital input $X_Q = X_3$ being applied to the second DAC 420, an analog output $Y_Q = Y_3$ is generated. The gain amplifier 430 generates an analog output $Y'_Q = Y_3 \cdot \exp(h \cdot C_2)$, where $\exp(h \cdot C_2)$ is the gain of the gain amplifier 430 when the gain amplifier 430 is controlled by the second control value $C_2$. The ADC 450 receives the analog output $Y'_Q$ of the gain amplifier 430 and generates a digital output $Z = Z_3$. In this embodiment, the above-mentioned third gain value $R_2$ is the gain of the serially connected second DAC 420, gain amplifier 430, and ADC 450. The third gain value $R_3$ can be expressed by the following equation:

$$R_3 = (Z_3/X_3) = \rho_{ZY} \cdot \exp(h \cdot C_2) \cdot \rho_{YXQ} \qquad (11)$$

Step 540: Without utilizing a predetermined characteristic parameter, determine a calibration control value $C_C$ according to the first, second, third gain values $R_1$, $R_2$, $R_3$ and the first, second control values $C_1$, $C_2$. To compensate for the gain mismatch between the first DAC 410 and second DAC 420, the calculated calibration control value $C_c$ must ensure that the gain of the gain amplifier 430 when multiplied by the gain of the second DAC 420 will be equal to the gain of the first DAC 410. In other words, $\rho_{YXQ} 19 \exp(h \cdot C_C)$ must be equal to $\rho_{YXI}$. Therefore, in this step, the computation module 470 determines the calibration control value $C_C$ in an interpolating manner according to the following equation:

$$C_C = C_1 + (C_2 - C_1) \cdot [\log(R_1) - \log(R_2)] / [\log(R_3) - \log(R_2)] \qquad (12)$$
$$= C_1 + (C_2 - C_1) \cdot [\log(R_1/R_2)] / [\log(R_3/R_2)]$$

Please note that if the calibration control value $C_C$ does not lie between $C_1$ and $C_2$, is it said that the computation module 470 determines the calibration control value $C_C$ in an extrapolating manner, however, the used equation is still the same.

Step 550: Control the gain amplifier 430 with the calibration control value $C_C$ determined by the computation module 470 to compensate for the gain mismatch between the first DAC 410 and second DAC 420. In this step, the first DAC 410 is switched back to its original position in the I transmission channel of the transceiver (or transmitter), the second DAC 420 and the gain amplifier 430 are switched back to their original positions in the Q transmission channel of the transceiver (or transmitter). With the gain amplifier 430 being controlled by the calibration control value $C_C$, the gain mismatch between the first DAC 410 and the second DAC 420 is then compensated.

Please note that if the above-mentioned digital values $X_1$, $X_2$, and $X_3$ are all equivalent, the computational module 470 can directly determines the calibration control value $C_C$ according to the digital values $Z_1$, $Z_2$, $Z_3$ and the control values $C_1$, $C_2$. The utilized equation is as follows:

$$C_C = C_1 + (C_2 - C_1) \cdot [\log(Z_1) - \log(Z_2)] / [\log(Z_3) - \log(Z_2)] \qquad (13)$$
$$= C_1 + (C_2 - C_1) \cdot [\log(Z_1/Z_2)] / [\log(Z_3/Z_2)]$$

In the above-mentioned embodiment, there is an advantage in utilizing a single ADC as the measuring tool. By utilizing a single ADC the gain mismatch problem between different ADCs is avoided. If more than one ADC is utilized as the measuring tools then the situation becomes more complex.

Figure 6:
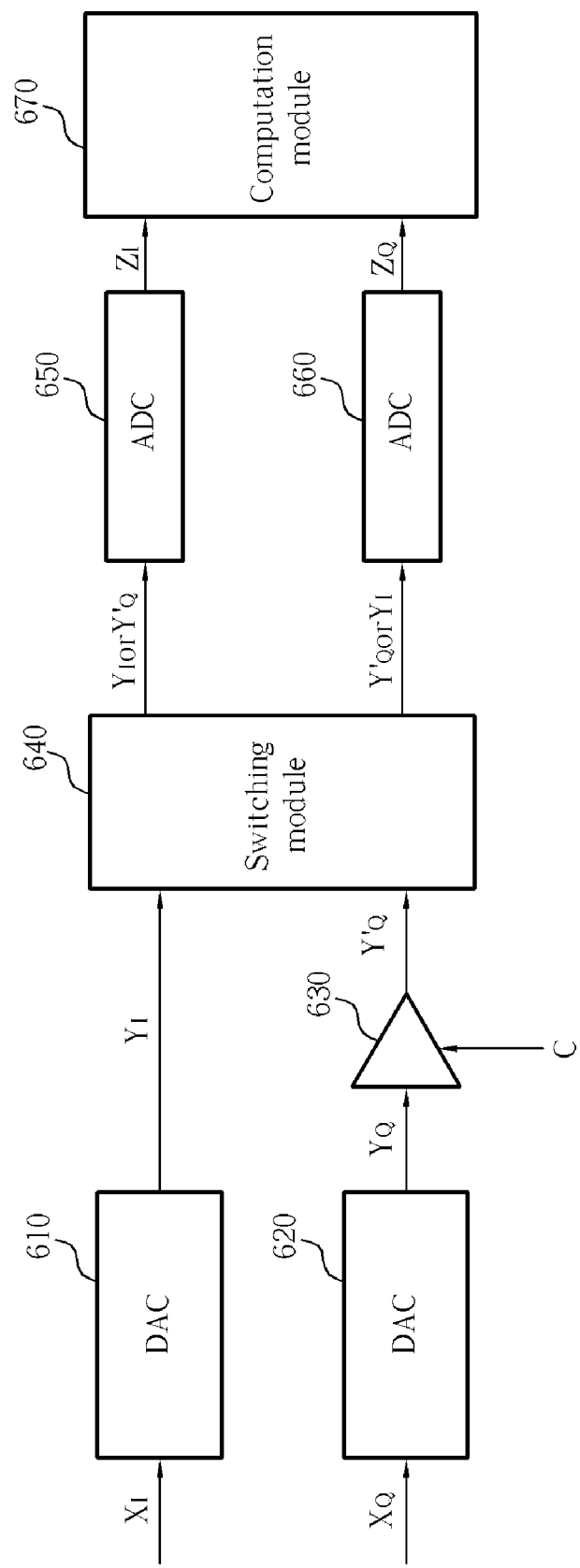
FIG. 6 is a block diagram showing how circuit components are disposed according to a second embodiment of the present invention.

Please refer to FIG. 6. FIG. 6 is a block diagram showing how circuit components are disposed according to a second embodiment of the present invention. The block diagram shown in FIG. 6 includes a first DAC 610, a second DAC 620, a gain amplifier 630, a switching module 640, a first ADC 650, a second ADC 660, and a computation module 670. For example, the first DAC 610 and second DAC 620 are DACs of an I transmission channel and Q transmission channel of a transceiver respectively; the first ADC 650 and the second ADC 660 are ADCs in the I receiving channel and Q receiving channel of the transceiver. Certainly, the first ADC 650 and the second ADC 660 can also be ADCs built in a transmitter, which includes the first DAC 610 and second DAC 620. The gain amplifier 630 amplifies an analog signal $Y_Q$ outputted by the second DAC 620 to generate another analog signal $Y'_Q$; a gain value G of the gain amplifier 630 is controlled by a control value C. The switching module 640 has two modes. In the first mode the switching module 640 connects the first DAC 610 with the first ADC 650, and connects the gain amplifier 630 with the second ADC 660. In the second mode the switching module 640 connects the first DAC 610 with the second ADC 660, and connects the gain amplifier 630 with the first ADC 650.

For the ease of explanation, in the following paragraphs when the switching module 640 is set to the first mode, a signal path formed by the serially connected first DAC 610 and first ADC 650 will be referred to as a first signal path; a signal path formed by the serially connected second DAC 620, gain amplifier 630, and second ADC 660 will be referred to as a second signal path. When the switching module 640 is set to the second mode, a signal path formed by the serially connected first DAC 610 and second ADC 660 will be referred to as a third signal path; a signal path formed by the serially connected second DAC 620, gain amplifier 630, and first ADC 650 will be referred to as a fourth signal path.

Figure 7:
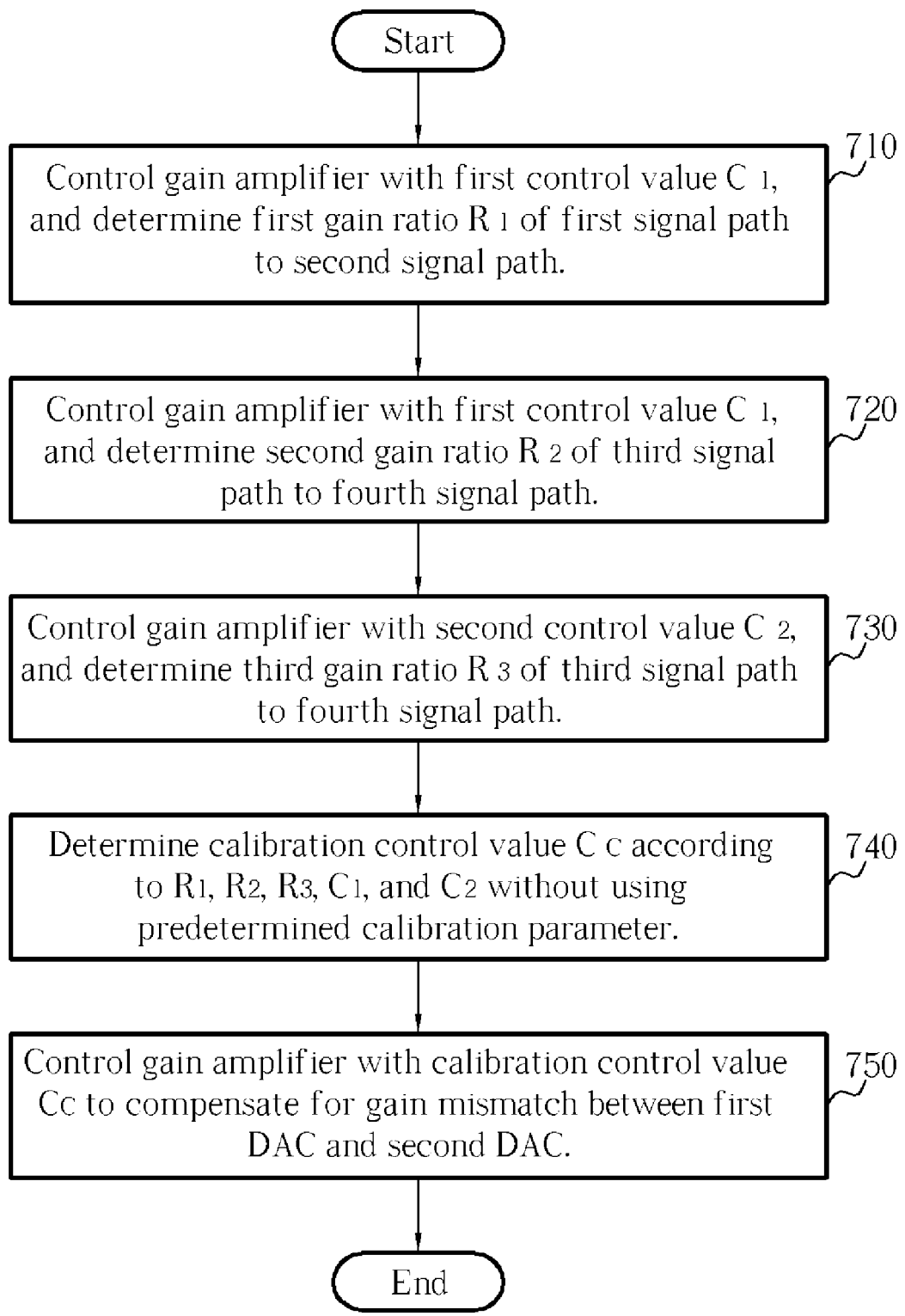
FIG. 7 is a flowchart illustrating a method performed by the apparatus of FIG. 6.

FIG. 7 shows a flowchart illustrating a method performed by the apparatus of FIG. 6. The flowchart shown in FIG. 7 includes the following steps:

Step 710: Control the gain amplifier 630 with a first control value $C_1$, and determine a first gain ratio $R_1$ of the first signal path to the second signal path. In this step, the switching module 640 is set to the first mode. The digital output $Z_I$ of the first ADC 650 and the digital output ZQ of the second ADC 660 are as follows:

$$Z_I = \rho_{ZYI} \cdot \rho_{YXI} \cdot X_I \qquad (14)$$

$$Z_Q = \rho_{ZYQ} \cdot \exp(h \cdot C_1) \cdot \rho_{YXQ} \cdot X_Q \qquad (15)$$

where $X_I$ and $X_Q$ are digital inputs of the first DAC 610 and second DAC 620 respectively; $\rho_{YXI}$ and $\rho_{YXQ}$ are gains of the first DAC 610 and second DAC 620 respectively; $\rho_{ZYI}$ and $\rho_{ZYQ}$ are gains of the first ADC 650 and second ADC 660 respectively; and $\exp(h \cdot C_1)$ is the gain of the gain amplifier 630 when it is controlled by the first control value $C_1$.

When $X_I = X_Q$, the computation module 670 can utilize the digital outputs $Z_I$ and $Z_Q$ of the first ADC 650 and second ADC 660 to determine the first gain ratio $R_1$. The equation is as follows:

$$R_1 = Z_I / Z_Q \qquad (16)$$

$$= (\rho_{ZYI} / \rho_{ZYQ}) \cdot (\rho_{YXI} / \rho_{YXQ}) / \exp(h \cdot C_1)$$

$$= G_{RX} \cdot G_{TX} / \exp(h \cdot C_1)$$

where $G_{RX} = \rho_{ZYI}/\rho_{ZYQ}$ represents the gain mismatch between the first ADC 650 and second ADC 660; $G_{TX} = \rho_{YXI}/\rho_{YXQ}$ represents the gain mismatch between the first DAC 610 and second DAC 620.

Step 720: Control the gain amplifier 630 with the first control value $C_1$, and determine a second gain ratio $R_2$ of the third signal path to the fourth signal path. In this step, the switching module 640 is set to the second mode. The digital output $Z_I$ of the first ADC 650 and the digital output ZQ of the second ADC 660 are as follows:

$$Z_I = \rho_{ZYI} \cdot \exp(h \cdot C_1) \cdot \rho_{YXQ} \cdot X_Q \qquad (17)$$

$$Z_Q = \rho_{ZYQ} \cdot \rho_{YXI} \cdot X_I \qquad (18)$$

When $X_I = X_Q$, the computation module 670 can utilize the digital outputs $Z_I$ and $Z_Q$ of the first ADC 650 and second ADC 660 to determine the second gain ratio $R_2$. The equation is as follows:

$$R_2 = Z_Q / Z_I \qquad (19)$$

$$= (\rho_{YXI} / \rho_{YXQ}) / [(\rho_{ZYI} / \rho_{ZYQ}) \cdot \exp(h \cdot C_1)]$$

$$= G_{TX} / [G_{RX} \cdot \exp(h \cdot C_1)]$$

Step 730: Control the gain amplifier 630 with a second control value $C_2$, and determine a third gain ratio $R_2$ of the third signal path to the fourth signal path. In this step, the switching module 640 is set to the second mode. The digital output $Z_I$ of the first ADC 650 and the digital output ZQ of the second ADC 660 are as follows:

$$Z_I = \rho_{ZYI} \cdot \exp(h \cdot C_2) \cdot \rho_{YXQ} \cdot X_Q \qquad (20)$$

$$Z_Q = \rho_{ZYQ} \cdot \rho_{YXI} \cdot X_I \qquad (21)$$

When $X_I = X_Q$, the computation module 670 can utilize the digital outputs $Z_I$ and $Z_Q$ of the first ADC 650 and second ADC 660 to determine the third gain ratio $R_3$. The equation is as follows:

$$R_3 = Z_Q / Z_I \qquad (22)$$

$$= (\rho_{YXI} / \rho_{YXQ}) / [(\rho_{ZYI} / \rho_{ZYQ}) \cdot \exp(h \cdot C_2)]$$

$$= G_{TX} / [G_{RX} \cdot \exp(h \cdot C_2)]$$

Step 740: Without utilizing a predetermined characteristic parameter, determine a calibration control value $C_C$ according to the first, second, third gain ratios $R_1$, $R_2$, $R_3$ and the first, second control values $C_1$, $C_2$. To compensate for the gain mismatch between the first DAC 610 and second DAC 620, the calculated calibration control value $C_C$ must ensure that the gain of the gain amplifier 630 when multiplied by the gain of the second DAC 620 will be equal to the gain of the first DAC 610. In other words, $\rho_{YXQ} \cdot \exp(h \cdot C_C)$ must be equal to $\rho_{YXI}$. Therefore, in this step, the computation module 670 determines the calibration control value $C_C$ in an interpolating manner according to the following equation:

$$C_C = C_1 + 0.5 \cdot (C_2 - C_1) \cdot \qquad (23)$$

$$[\log(R_1) + \log(R_2)] / [\log(R_2) - \log(R_3)]$$

$$= C_1 + 0.5 \cdot (C_2 - C_1) \cdot \log(R_1 \cdot R_2) / \log(R_2 / R_3)$$

Please note that if the calibration control value $C_C$ does not lie between $C_1$ and $C_2$, it is said that the computation module 670 determines the calibration control value $C_C$ in an extrapolating manner, however, the used equation remains the same.

Step 750: Control the gain amplifier 630 with the calibration control value $C_c$ determined by the computation module 670 to compensate for the gain mismatch between the first DAC 610 and second DAC 620. In this step, the first DAC 610 is switched back to its original position in the I transmission channel of the transceiver (or transmitter) and the second DAC 620 and the gain amplifier 630 are switched back to their original position in the Q transmission channel of the transceiver (or transmitter). With the gain amplifier 630 being controlled by the calibration control value $C_C$, the gain mismatch between the first DAC 410 and second DAC 420 is then compensated.

The present invention offers advantages. One advantage, no predetermined calibration parameter is used; therefore no additional memory space is required by the present invention. Another advantage is that even when different chips have different characteristics, or a single chip has different characteristics at different time points, the present invention still accurately compensates the IQ gain mismatch between two DACs of each single chip.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for compensating a gain mismatch between a first DAC and a second DAC, the second DAC being electrically connected to a gain amplifier, the method comprising:

determining a first gain value corresponding to the first DAC;

controlling the gain amplifier with a first control value, and determining a second gain value corresponding to the second DAC and the gain amplifier;

controlling the gain amplifier with a second control value, and determining a third gain value corresponding to the second DAC and the gain amplifier;

determining a calibration control value according to the first, second, third gain values and the first, second control values without utilizing a predetermined characteristic parameter; and controlling the gain amplifier with the calibration control value to compensate for the gain mismatch between the first DAC and the second DAC.

2. The method of claim 1, wherein the gain amplifier amplifies an analog signal generated by the second DAC.

3. The method of claim 1, wherein:

the step of determining the first gain value further comprises: connecting the first DAC to an ADC; and determining the first gain value according to a digital value generated by the ADC and a digital value applied to the first DAC;

the step of determining the second gain value further comprises: connecting the gain amplifier to the ADC; and determining the second gain value according to a digital value generated by the ADC and a digital value applied to the second DAC; and the step of determining the third gain value further comprises: connecting the gain amplifier to the ADC; and determining the third gain value according to a digital value generated by the ADC and a digital value applied to the second DAC.

4. The method of claim 1, wherein the calibration control value is determining according to the following equation:

$$C_C = C_1 + (C_2 - C_1) \cdot [\log(R_1) - \log(R_2)] / [\log(R_3) - \log(R_2)];$$

where $R_1$, $R_2$, and $R_3$ are the first, second, and third gain values respectively; $C_1$ and $C_2$ are the first and second control values respectively; and $C_C$ is the calibration control value.

5. The method of claim 1, wherein the method is utilized by a transmitter or a transceiver.

6. An apparatus for compensating a gain mismatch between a first DAC and a second DAC, the apparatus comprising:

a gain amplifier electrically connected to the second DAC, for amplifying an analog signal generated by the second DAC;

an ADC;

a switching module electrically connected to the first DAC, the gain amplifier, and the ADC, the switching module having a first mode and a second mode; under the first mode, the switching module setting the first DAC and the ADC as first a signal path; under the second mode, the switching module setting the second DAC, the gain amplifier, and the ADC as a second signal path; and a computation module, for determining a first gain value of the first signal path, determining a second gain value of the second signal path when a first control value is utilized to control the gain amplifier, determining a third gain value of the second signal path when a second control value is utilized to control the gain amplifier, and determining a calibration control value according to the first, second, third gain values and the first, second control values without utilizing a predetermined characteristic parameter;

wherein the apparatus utilizes the calibration control value determined by the computation module to control the gain amplifier to compensate for the gain mismatch between the first DAC and the second DAC.

7. The apparatus of claim 6, wherein the computation module determining the calibration control value according to the following equation:

$$C_C = C_1 + (C_2 - C_1) \cdot [\log(R_1) - \log(R_2)] / [\log(R_3) - \log(R_2)];$$

where $R_1$, $R_2$, and $R_3$ are the first, second, and third gain values respectively; $C_1$ and $C_2$ are the first and second control values respectively; and $C_C$ is the calibration control value.

8. The apparatus of claim 6, wherein the apparatus is set in a transmitter or a transceiver.

9. A method for compensating a gain mismatch between a first DAC and a second DAC, the second DAC being electrically connected to a gain amplifier, the method comprising:

controlling the gain amplifier with a first control value, and determining a first gain ratio of a first signal path to a second signal path;

controlling the gain amplifier with the first control value, and determining a second gain ratio of a third signal path to a fourth signal path;

controlling the gain amplifier with a second control value, and determining a third gain ratio of the third signal path to the fourth signal path;

determining a calibration control value according to the first, second, third gain ratios and the first, second control values without utilizing a predetermined characteristic parameter; and controlling the gain amplifier with the calibration control value to compensate for the gain mismatch between the first DAC and the second DAC;

wherein the first signal path corresponds to the first DAC and a first ADC, the second signal path corresponds to the second DAC, the gain amplifier and a second ADC, the third signal path corresponds to the first DAC and the second ADC, the fourth signal path corresponds to the second DAC, the gain amplifier and the first ADC.

10. The method of claim 9, wherein the gain amplifier amplifies an analog signal generated by the second DAC.

11. The method of claim 9, wherein the calibration control value is determining according to the following equation:

$$C_C = C_1 + 0.5 \cdot (C_2 - C_1) \cdot [\log(R_1) + \log(R_2)] / [\log(R_2) - \log(R_3)];$$

where $R_1$, $R_2$, and $R_3$ are the first, second, and third gain ratios respectively; $C_1$ and $C_2$ are the first and second control values respectively; and $C_C$ is the calibration control value.

12. The method of claim 9, wherein the method is utilized by a transmitter or a transceiver.

13. An apparatus for compensating a gain mismatch between a first DAC and a second DAC, the apparatus comprising:

a gain amplifier electrically connected to the second DAC, for amplifying an analog signal generated by the second DAC;

a first ADC;

a second ADC;

a switching module electrically connected to the first DAC, the gain amplifier, the first ADC, and the second ADC, the switching module having a first mode and a second mode;

under the first mode, the switching module setting the first DAC and the first ADC as a first signal path, setting the second DAC, the gain amplifier, and the second ADC as a second signal path; under the second mode, the switching module setting the first DAC and the second ADC as a third signal path, setting the second DAC, the gain amplifier, and the first ADC as a fourth signal path; and a computation module, for determining a first gain ratio of the first signal path to the second signal path when a first control value is utilized to control the gain amplifier; determining a second gain ratio of the third signal path to the fourth signal path when the first control value is utilized to control the gain amplifier; determining a third gain ratio of the third signal path to the fourth signal path when the second control value is utilized to control the gain amplifier; and determining a calibration control value according to the first, second, third gain ratios and the first, second control values without utilizing a predetermined characteristic parameter;

wherein the apparatus utilizes the calibration control value determined by the computation module to control the gain amplifier to compensate for the gain mismatch between the first DAC and the second DAC.

14. The apparatus of claim 13, wherein the computation module determines the calibration control value according to the following equation:

$$C_C = C_1 + 0.5 \cdot (C_2 - C_1) \cdot [\log(R_1) + \log(R_2)] / [\log(R_2) - \log(R_3)];$$

where $R_1$, $R_2$, and $R_3$ are the first, second, and third gain ratios respectively; $C_1$ and $C_2$ are the first and second control values respectively; and $C_C$ is the calibration control value.

15. The apparatus of claim 13, wherein the apparatus is set in a transmitter or a transceiver.

* * * * *